(12) United States Patent
Fujita et al.

(10) Patent No.: US 9,627,741 B2
(45) Date of Patent: Apr. 18, 2017

(54) WIRELESS MODULE AND WIRELESS DEVICE

(71) Applicant: Panasonic Intellectual Property Management Co., Ltd., Osaka (JP)

(72) Inventors: Suguru Fujita, Tokyo (JP); Ryosuke Shiozaki, Tokyo (JP); Kentaro Watanabe, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 91 days.

(21) Appl. No.: 14/420,297

(22) PCT Filed: May 23, 2014

(86) PCT No.: PCT/JP2014/002717
§ 371 (c)(1),
(2) Date: Feb. 6, 2015

(87) PCT Pub. No.: WO2014/196144
PCT Pub. Date: Dec. 11, 2014

(65) Prior Publication Data
US 2015/0214598 A1    Jul. 30, 2015

(30) Foreign Application Priority Data

Jun. 4, 2013  (JP) ................................ 2013-117974

(51) Int. Cl.
*H01Q 1/02*  (2006.01)
*H01Q 1/24*  (2006.01)
(Continued)

(52) U.S. Cl.
CPC ............ *H01Q 1/02* (2013.01); *H01Q 1/2283* (2013.01); *H01Q 1/24* (2013.01); *H01Q 21/06* (2013.01);
(Continued)

(58) Field of Classification Search
CPC ....... H01Q 1/02; H01Q 1/2283; H05K 1/0203
See application file for complete search history.

(56) References Cited

U.S. PATENT DOCUMENTS

2004/0077124 A1* 4/2004 Ogawa ................ H01L 21/4857
438/106
2011/0235278 A1 9/2011 Hara

FOREIGN PATENT DOCUMENTS

JP  2000-223630  8/2000
JP  2007-027277  2/2007
(Continued)

OTHER PUBLICATIONS

International Search Report of PCT application No. PCT/JP2014/002717 dated Aug. 26, 2014.

*Primary Examiner* — Hoang Nguyen
*Assistant Examiner* — Michael Bouizza
(74) *Attorney, Agent, or Firm* — Seed IP Law Group LLP

(57) ABSTRACT

As a wireless module which is capable of improving heat dissipation while suppressing degradation of antenna characteristics, there is provided a wireless module including: a first substrate having a first surface on which a plurality of antennas and a ground portion are disposed; and a heat dissipating member disposed opposite the first surface of the first substrate. The heat dissipating member includes a plurality of openings corresponding to the plurality of antennas respectively and an intervening portion which intervenes between the plurality of openings. The ground portion is disposed between the first substrate and the heat dissipating member.

9 Claims, 6 Drawing Sheets

(51) Int. Cl.
*H01Q 21/06* (2006.01)
*H01Q 23/00* (2006.01)
*H05K 1/02* (2006.01)
*H01Q 1/22* (2006.01)
*H05K 1/14* (2006.01)

(52) U.S. Cl.
CPC ........... *H01Q 23/00* (2013.01); *H05K 1/0203* (2013.01); *H05K 1/0243* (2013.01); *H05K 1/0298* (2013.01); *H05K 1/141* (2013.01); *H05K 2201/10098* (2013.01)

(56) References Cited

FOREIGN PATENT DOCUMENTS

| | | |
|---|---|---|
| JP | 2010-245373 A | 10/2010 |
| WO | 2010/067725 A1 | 6/2010 |

\* cited by examiner

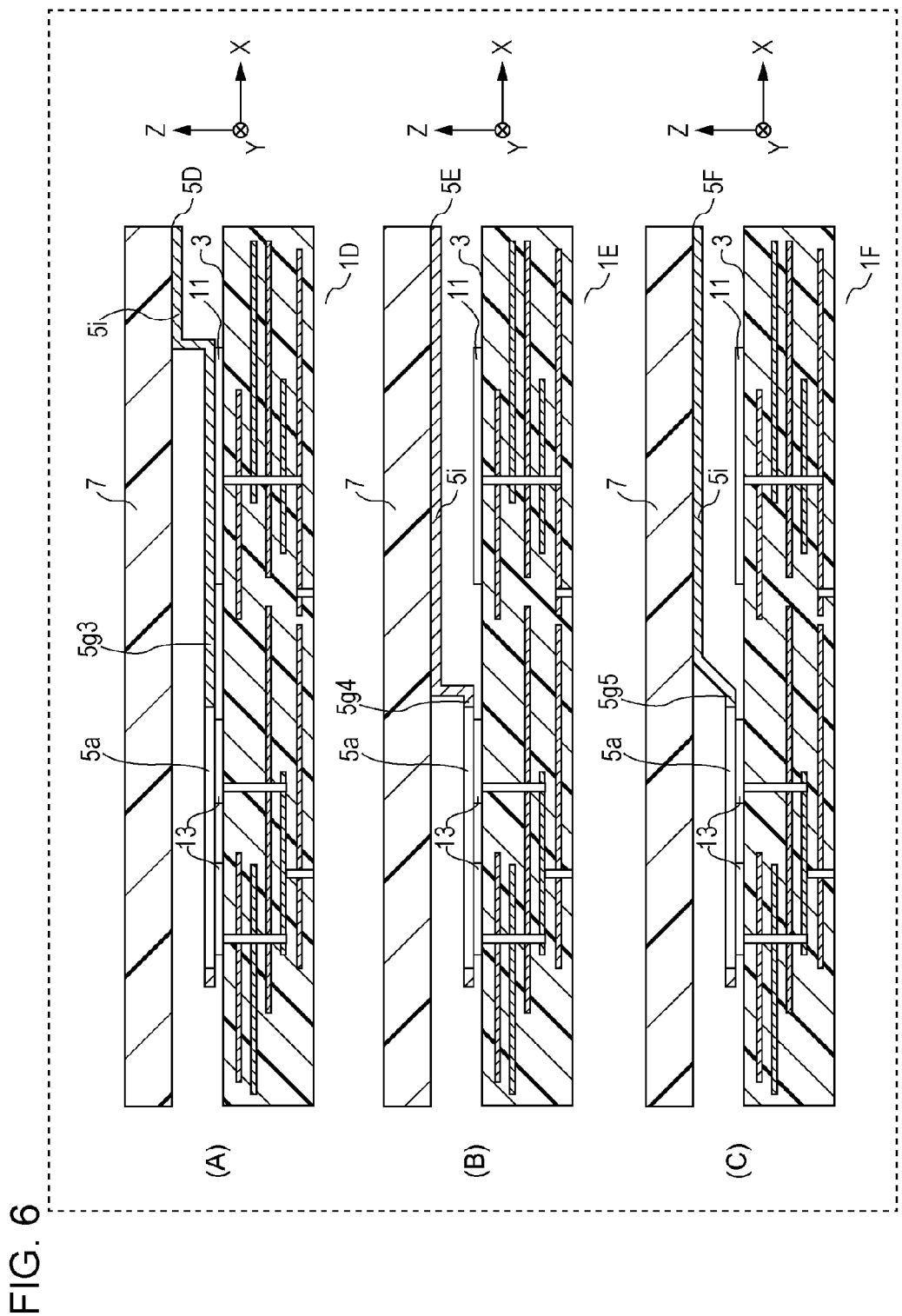

WIRELESS MODULE AND WIRELESS DEVICE

This application claims priority to Japanese Patent Application No. 2013-117974, filed on Jun. 4, 2013, the contents of which are hereby incorporated by reference.

TECHNICAL FIELD

The present disclosure relates to a wireless module and a wireless apparatus.

BACKGROUND ART

Hitherto, a module including a heat dissipating component for transferring heat generated in an electronic component in the module is known (see, for example, PTL 1). On a cover of the module, a "V" shaped metallic piece is provided in an opening which opposes the electronic component. The metallic piece is brought into contact with the surface of the electronic component, thereby dissipating heat generated from the electronic component.

CITATION LIST

Patent Literature

PTL 1: Japanese Unexamined Patent Application

SUMMARY OF INVENTION

Technical Problem

In the module disclosed in PTL 1, it is difficult to improve heat dissipation while suppressing degradation of antenna characteristics.

One non-limiting and exemplary embodiment provides a wireless module that is capable of improving heat dissipation while suppressing degradation of antenna characteristics.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

Solution to Problem

A wireless module of the present disclosure includes: a first substrate having a first surface on which a plurality of antennas and a ground portion are disposed; and a heat dissipating member disposed opposite the first surface of the first substrate. The heat dissipating member includes openings to which the plurality of associated antennas are exposed and an intervening portion which intervenes between the openings, and the ground portion is disposed between the first substrate and the heat dissipating member.

These general and specific aspects may be implemented using a system, a method, and a computer program, and any combination of systems, method, and computer programs.

Advantageous Effects of Invention

According to the present disclosure, it is possible to improve heat dissipation while suppressing degradation of antenna characteristics.

BRIEF DESCRIPTION OF DRAWINGS

FIG. 5(B) is a sectional view illustrating an example of the structure of a wireless module of a second first modified example.

FIG. 6 is a sectional view illustrating an example of the structure of a wireless module of a third modified example, a sectional view illustrating an example of the structure of a wireless module of a fourth modified example, and a sectional view illustrating an example of the structure of a wireless module of a fifth modified example.

DESCRIPTION OF EMBODIMENTS

Embodiments of the present disclosure will be described below with reference to the drawings.

(Underlying Knowledge Forming Basis of an Embodiment of the Present Disclosure)

The module disclosed in PTL 1 is not a wireless module on which an antenna is mounted. Accordingly, when a heat dissipating component is simply provided in a wireless module on which an antenna is mounted, it may be possible that antenna characteristics be decreased due to the provision of the heat dissipating component.

A wireless module that is capable of improving heat dissipation while suppressing degradation of antenna characteristics will be described below.

First Embodiment

Figure 1:
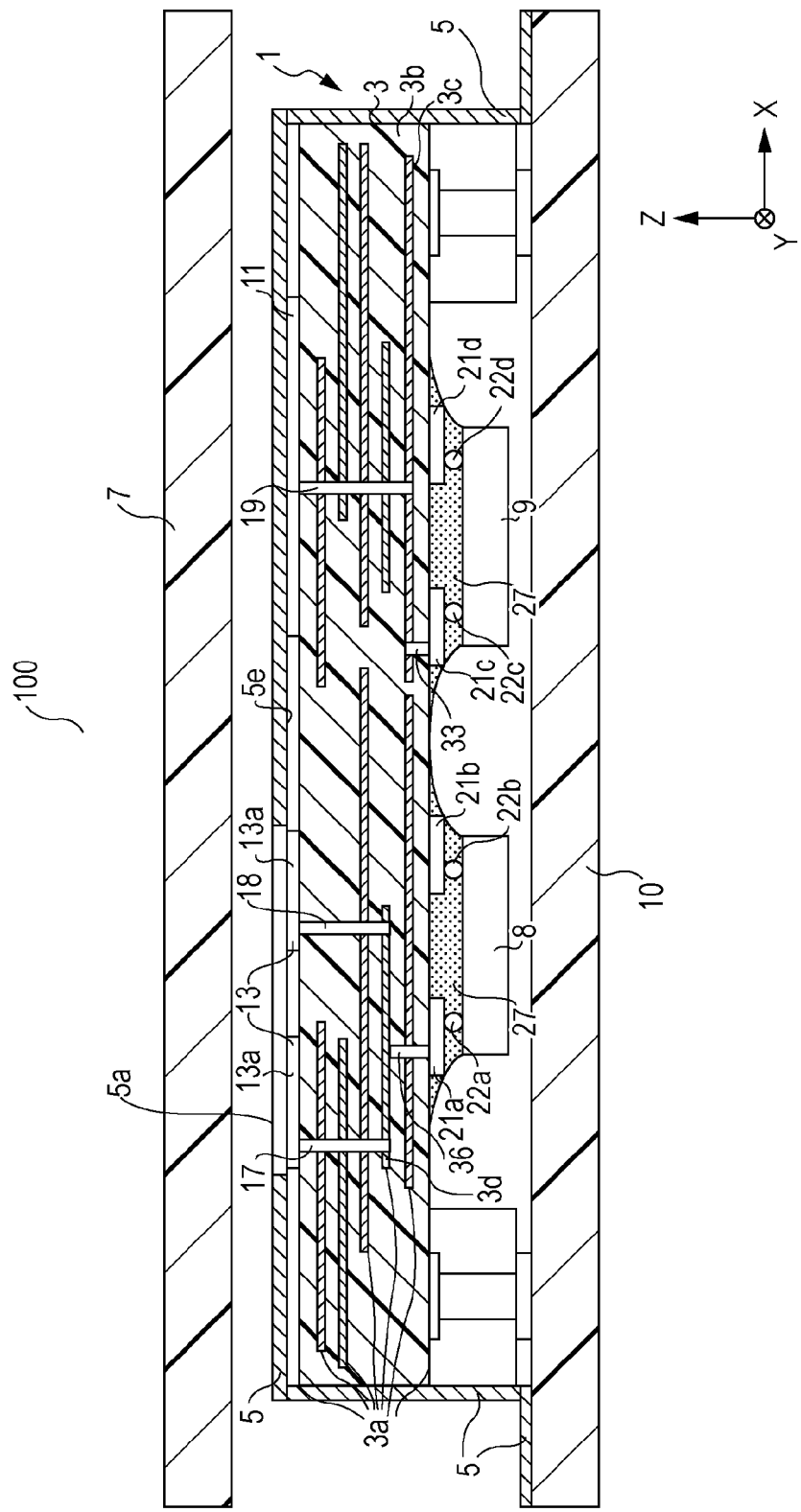
FIG. 1 is a sectional view illustrating an example of the structure of a wireless apparatus of a first embodiment.
Figure 2:
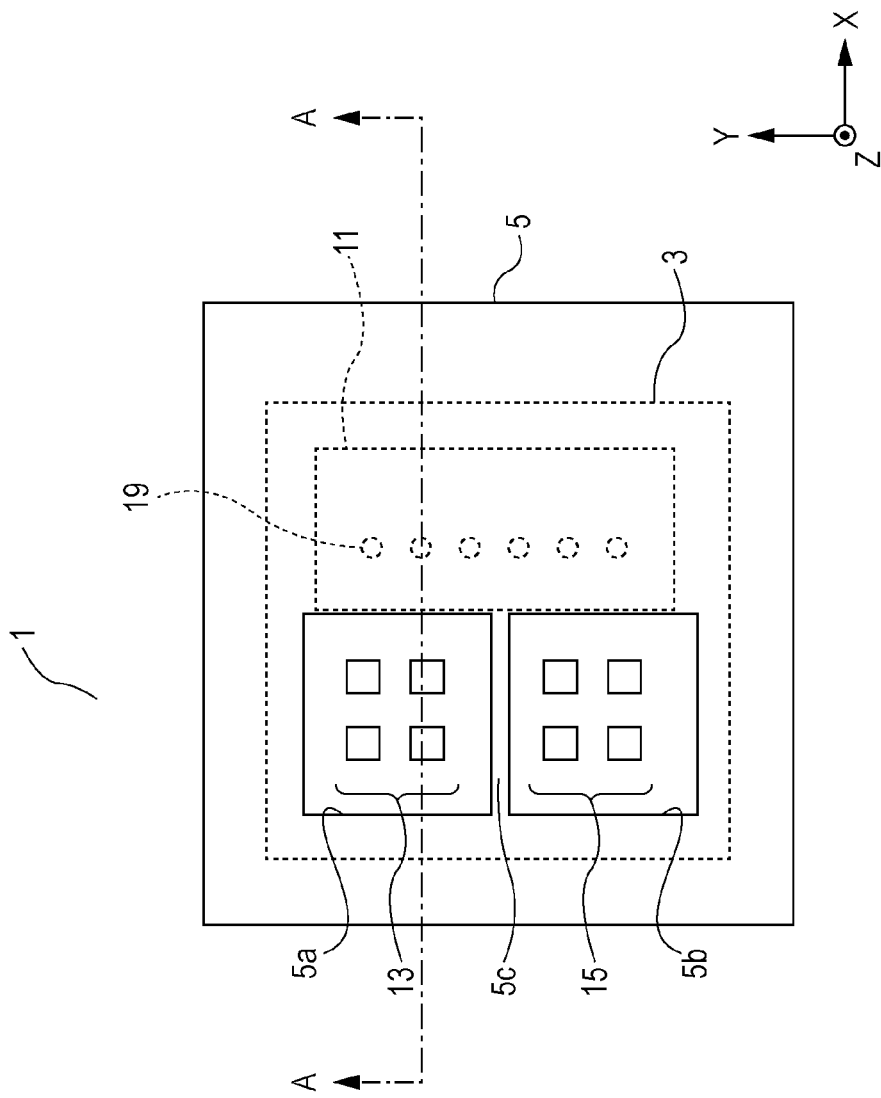
FIG. 2 is a plan view illustrating an example of the structure of a wireless module of the first embodiment.

FIG. 1 is a sectional view illustrating an example of the structure of a wireless apparatus 100 of a first embodiment, taken along line A-A of a wireless module 1 shown in FIG. 2.

A surface parallel with a surface of a module substrate 3 is defined as an X-Y plane. In FIG. 1, the horizontal direction is defined as an X direction, and the depthwise direction is defined as a Y direction. The direction perpendicular to the surface of the module substrate, that is, the direction perpendicular to the X-Y plane is defined as a Z direction.

Figure 3:
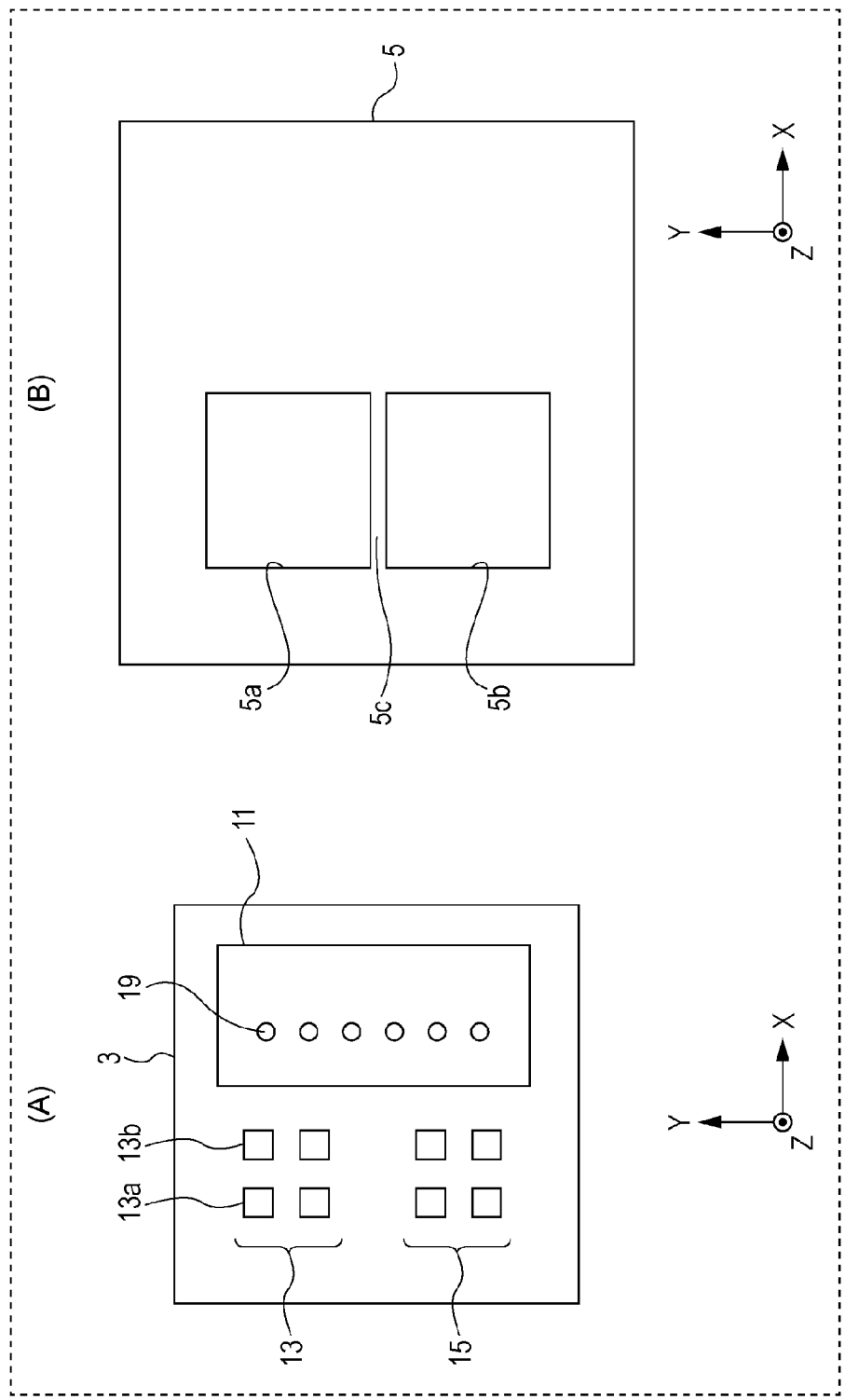
FIG. 3 shows plan views illustrating an example of the configuration of a module substrate and an example of the configuration of a heat dissipating component.

FIG. 2 is a plan view illustrating an example of the structure of the wireless module 1. FIG. 3(A) is a plan view illustrating an example of the configuration of the module substrate 3. FIG. 3(B) is a plan view illustrating an example of the configuration of a heat dissipating component 5.

As shown in FIG. 1, the wireless module 1 includes the module substrate 3 and the heat dissipating component 5. Antennas 13 and 15 are mounted on one surface of the module substrate 3. The heat dissipating component 5 covers the module substrate (first substrate) 3. The wireless module 1 is stored in a housing 7 and is mounted on a set substrate 10. The set substrate 10 is, for example, a multilayer substrate. The wireless module 1, the set substrate (second substrate) 10, and the housing 7 form the wireless apparatus 100.

The module substrate 3 is a multilayer substrate formed in, for example, a square sheet-like shape and including, for example, seven metallic layers 3a and dielectric layers 3b which intervenes between the metallic layers 3a. On the topmost layer of the module substrate 3, the antennas 13 and 15 (see FIG. 2) which are each constituted by, for example, 2×2 (four) patch antennas, are mounted (disposed).

The antennas 13 and 15 are mounted on the top surface of the module substrate 3. However, the antennas 13 and 15 may be disposed on at least one surface of the module substrate 3, for example, on the bottom surface thereof. On the topmost surface of the module substrate 3, a ground (GND) pattern 11 is also formed (disposed) adjacent to the antennas 13 and 15.

LSIs 8 and 9 are mounted on the bottommost surface of the module substrate 3 with pads 21a through 21d and solder balls 22a through 22d therebetween. A molding portion 27 in which a resin, for example, is charged, is formed between the LSIs 8 and 9 and the bottom surface of the module substrate 3 such that it covers the pads 21a through 21d and the solder balls 22a through 22d.

The position of the LSI 8 in the X direction is, for example, substantially the same as that of the antenna 13. That is, the LSI 8 and the antenna 13 are disposed at a position at which they at least partially overlap each other. The LSI 8 includes, for example, a RF (Radio Frequency) IC (Integrated Curcuit) for processing microwave signals, and microwave signals are transmitted from the LSI 8 to the antenna 13. The antenna 13 is connected to the LSI 8 through signal via-holes 17 and 18 for respectively connecting patch antennas 13a and 13b and a wiring layer 3d. The antenna 13 is also connected to the LSI 8 through a signal via-hole 36, the pad 21a, and the solder ball 22a. The signal via-hole 36 connects the wiring layer 3d and the pad 21a.

The position of the LSI 9 in the X direction is, for example, substantially the same as that of the GND pattern 11. That is, the LSI 9 and the GND pattern 11 are disposed at a position at which they at least partially overlap each other. The LSI 9 includes a baseband IC, which is an electronic component that processes baseband signals and generates a predetermined amount or a greater amount of heat. The GND pattern 11 is connected to a GND of the LSI 9. The GND pattern 11 is connected to a GND layer 3c through a GND via-hole 19. The GND layer 3c is connected to the pad 21c through a GND via-hole 33, and the pad 21c is connected to the GND of the LSI 9 through the solder ball 22c.

With this configuration, heat generated within the LSI 9 is mostly conducted to the GND pattern 11 through the solder ball 22c, the pad 21c, the GND via-hole 33, the GND layer 3c, and the GND via-hole 19.

FIG. 1 illustrates a sectional view taken along line A-A of FIG. 2 including the antenna 13 by way of example. The structure of a cross section including the antenna 15 parallel with the cross section taken along line A-A is similar to the structure shown in FIG. 1.

As shown in FIG. 3(A), on the top surface of the module substrate 3, the above-described antennas 13 and 15 each including 2×2 patch antennas and the above-described GND pattern 11 positioned adjacent to the antennas 13 and 15 are disposed.

As shown in FIG. 3(B), the heat dissipating component 5 (an example of a heat dissipating member) covers the module substrate 3 which is formed in, for example, a square sheet-like shape. The area of the surface (substrate opposing surface) of the heat dissipating component 5 opposing the substrate surface of the module substrate 3 is greater than that of the substrate surface of the module substrate 3.

The heat dissipating component 5 covers, not only the top surface of the module substrate 3, but also the right and left side surfaces thereof, that is, the surfaces along the Z direction, and extends along the set substrate 10. Accordingly, the entirety of the wireless module 1 is covered by the set substrate 10 and the heat dissipating component 5. In a case where the wireless module 1 is not entirely covered, it is sufficient if at least two sides of the heat dissipating component 5 extend along the set substrate 10. In this case, the heat dissipating component 5 is formed in a rectangular shape, and at the shorter sides of the rectangle, two sides extend along the set substrate 10.

As the material for the heat dissipating component 5, a material having a high thermal conductivity, that is, a low thermal resistance, is used. More specifically, for example, a metal (for example, beryllium copper) or graphite, may be used. The heat dissipating component 5 conducts heat from, for example, the LSIs 8 and 9 mounted on the module substrate 3, to the set substrate 10 via the GND pattern 11, thereby enhancing the heat dissipation effect.

A substrate opposing surface 5e of the heat dissipating component 5 is fixed on the top surface of the module substrate 3 so that it may be thermally in contact with the top surface of the GND pattern 11. The meaning of "thermally in contact with" includes both of a case in which the substrate opposing surface 5e is physically connected to the top surface of the GND pattern 11 and a case in which the substrate opposing surface 5e is not physically connected to the top surface of the GND pattern 11.

With this configuration, heat from, for example, the LSI 9, can be more easily conducted to the heat dissipating component 5 via the GND pattern 11, thereby enhancing the heat dissipation effect.

Instead of simply causing the heat dissipating component 5 to be in contact with the GND pattern 11, they may be connected to each other by, for example, soldering, in which case, it is even easier to conduct heat.

As shown in FIG. 2, two openings 5a and 5b are formed in the substrate opposing surface 5e of the heat dissipating component 5. The openings 5a and 5b are formed in, for example, a square shape. The provision of the openings 5a and 5b makes it possible to suppress degradation of radiation patterns of radio waves generated from the antennas 13 and 15. The number of openings is not restricted to two.

In the heat dissipating component 5, an intervening portion 5c for intervening between the openings 5a and 5b corresponding to the two antennas 13 and 15, respectively, is formed. By the provision of the intervening portion 5c, in the X-Y plane, the distances between the edges of the antennas 13 and the edges of the openings 5a are substantially equal to each other, and the distances between the edges of the antennas 15 and the edges of the openings 5b are substantially equal to each other. That is, the positional relationship between the opening 5a and the antennas 13 is substantially the same as that between the opening 5b and the antennas 15, and the openings 5a and 5b surround the antennas 13 and 15, respectively, for example, vertically and horizontally, with equal pitches. This makes it possible to prevent the disturbances of radiation patterns generated from the antennas 13 and 15 exposed to the inside of the openings 5a and 5b.

If antennas include, for example, 3×2 or 4×3 patch antennas, rectangular openings, for example, are formed in the heat dissipating component 5, instead of square openings. With this configuration, advantages similar to the above-described advantages are obtained.

When the wavelength of microwaves or higher wavelength is indicated by λ, the desirable size of the openings 5a and 5b is such that the openings 5a and 5b are separated from the 2×2 patch antenna elements in the X direction and in the Y direction by λ/2 or greater. For example, in the case of the use of millimeter waves of a 60 GHz band, since the wavelength λ is 5 mm, the distances of the edges of the openings 5a and 5b to each of the patch antenna elements are 5 mm/2=2.5 mm.

In the wireless module 1, the openings 5a and 5b are formed in the substrate opposing surface 5e of the heat dissipating component 5, which covers the module substrate 3 and is thermally in contact with the GND pattern 11, thereby making it possible to suppress degradation of antenna characteristics and to improve heat dissipation. The heat dissipating component 5, which is capable of distributing and conducting heat over a large area by itself, is able to conduct a greater amount of heat to the set substrate 10. Since the GND pattern 11 and the GND of the LSD 9 are connected to each other, it is possible to efficiently dissipate heat generated from an electronic component which generates a great amount of heat. Moreover, since the heat dissipating component 5 is fixed without providing an opening in the housing 7, no limitation is imposed on designing of wirings of the module substrate 3. Additionally, since the wireless module 1 can be reduced in size and thickness, it is easily mounted on a mobile device, which is an example of the wireless apparatus 100.

Second Embodiment

In the first embodiment, a heat dissipating component is thermally in contact with the set substrate 10. In a second embodiment, a case in which a heat dissipating component is thermally in contact with the housing 7, that is, heat dissipation is performed through the use of the housing 7, will be described.

Figure 4:
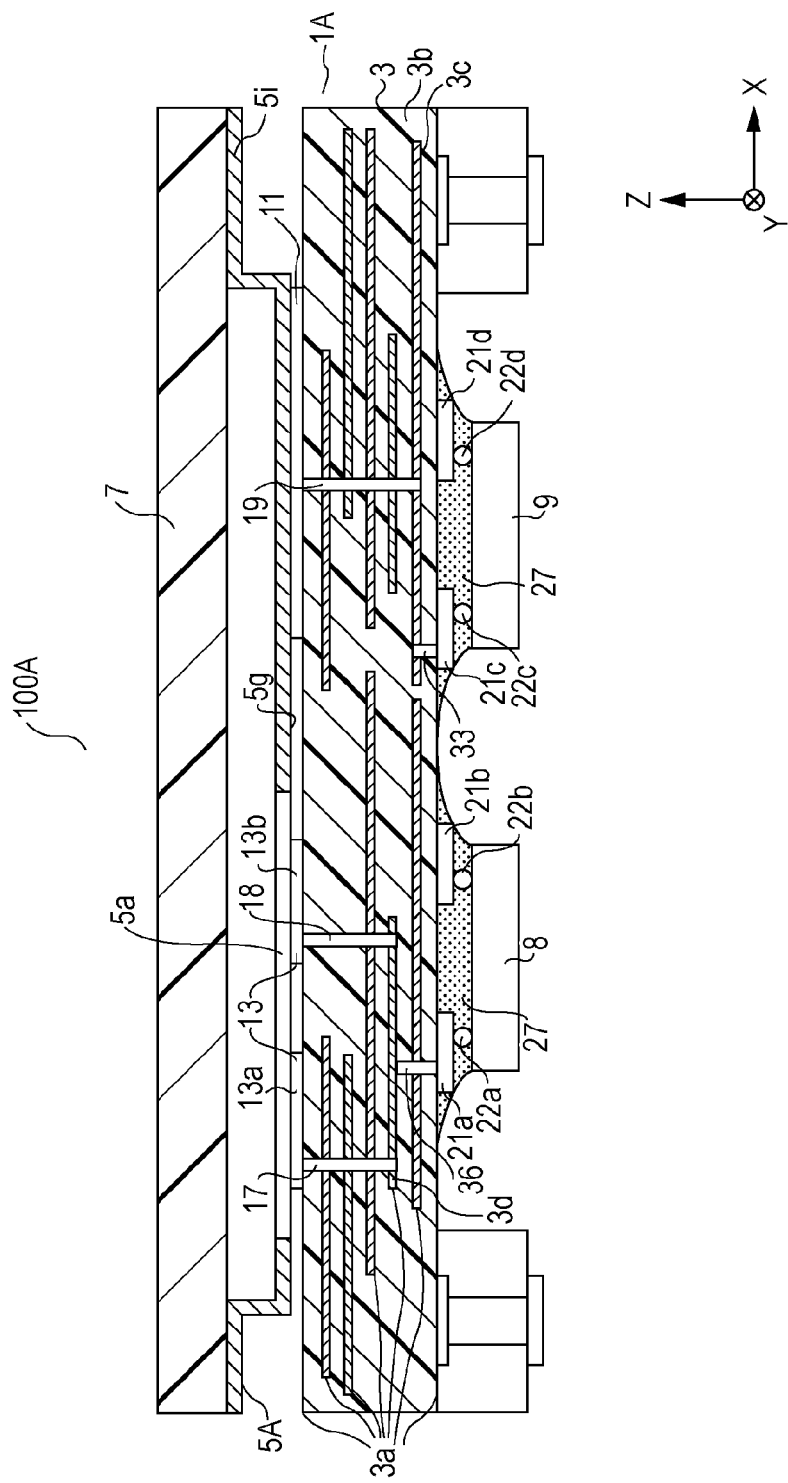
FIG. 4 is a sectional view illustrating an example of the structure of a wireless apparatus of a second embodiment.

FIG. 4 is a sectional view illustrating an example of the structure of a wireless apparatus 100A of the second embodiment. In the wireless apparatus 100A, the same elements as those of the wireless apparatus 100 of the first embodiment are designated by like reference numerals, and an explanation thereof will thus be omitted or simplified. In FIG. 4, the set substrate 10 is not shown.

The wireless apparatus 100A is different from the wireless apparatus 100 shown in FIG. 1 in that it includes a heat dissipating component 5A instead of the heat dissipating component 5. The heat dissipating component 5A covers the module substrate 3, and a recessed portion (an example a second portion) 5g is formed opposite the module substrate 3. The recessed portion 5g is disposed adjacent to the GND pattern 11 and bends toward the housing 7. The meaning of "disposed adjacent to" includes both of a case in which the recessed portion 5g is in physically contact with the GND pattern 11 and a case in which the recessed portion 5g is separated from the GND pattern 11 within a predetermined distance. Openings 5a and 5b which oppose the antennas 13 and 15, respectively, are formed in the surface of the recessed portion 5g.

A remaining portion 5i (an example of a first portion) of the heat dissipating component 5A other than the recessed portion 5g is in contact with or is connected to the housing 7 and is thermally in contact with the housing 7. The heat dissipating component 5A conducts heat generated from electronic components (for example, LSIs 8 and 9) mounted on the bottom surface of the module substrate 3 to the housing 7.

In the wireless module 1A, by the provision of the openings 5a and 5b, the degradation of the antenna characteristics can be suppressed, and since the heat dissipating component 5A is thermally in contact with the housing 7, heat is also conducted from the heat dissipating component 5A to the housing 7, thereby improving the heat dissipation efficiency. If a material having a high thermal conductivity is used for the housing 7, the heat dissipation effect can further be enhanced. By disposing part of the heat dissipating component 5A adjacent to the GND pattern 11, it is possible to even more efficiently dissipate heat generated from an electronic component (for example, LSI 9) which generates a great amount of heat.

MODIFIED EXAMPLES

Six modified examples of the wireless module 1A will be described below. In the modified examples, the main difference between heat dissipating components is the configurations thereof. When describing wireless modules 1B through 1F in the modified examples, an explanation of the configurations similar to the configuration of the wireless module 1A will be omitted.

Figure 5:
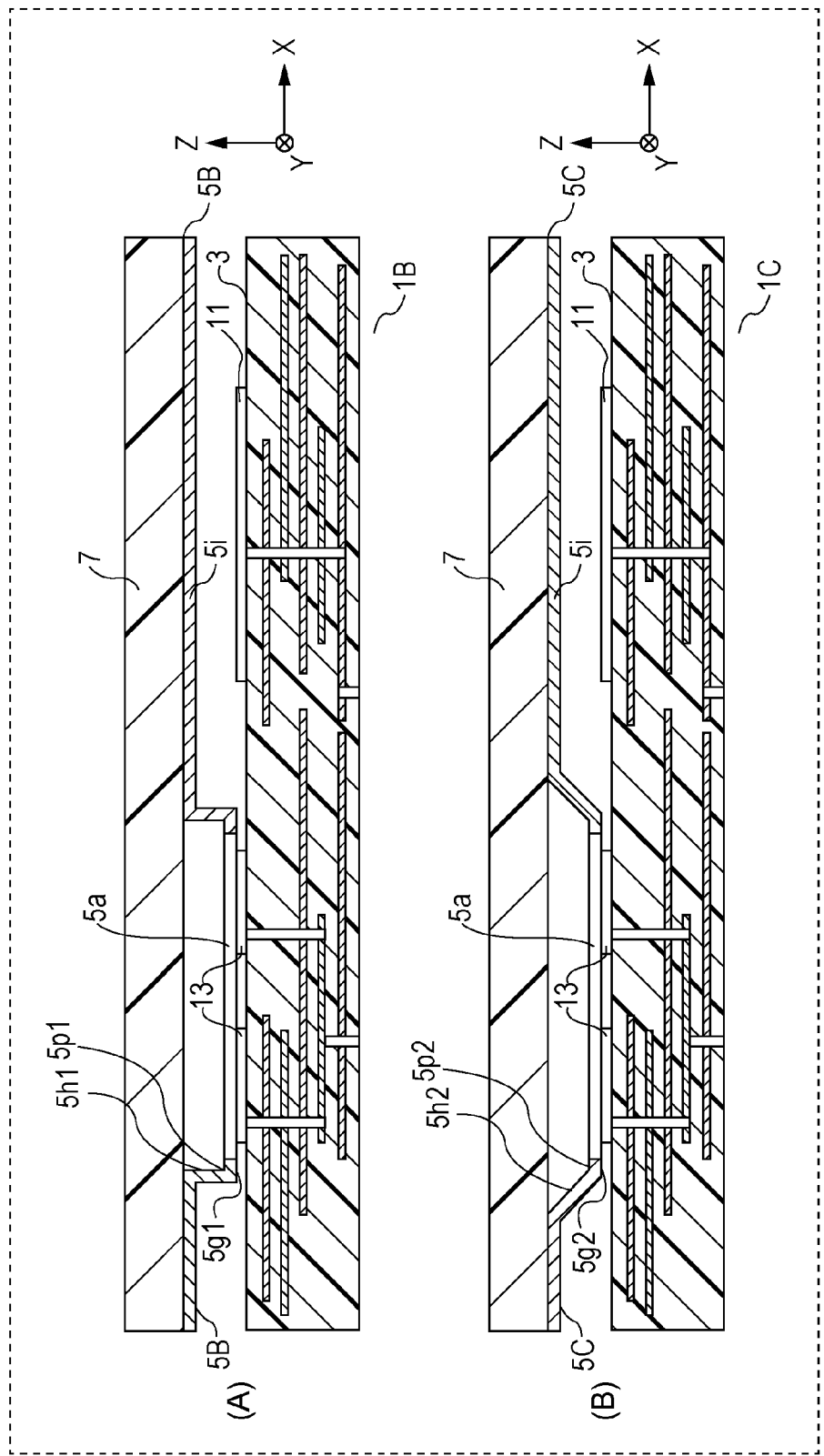
FIG. 5 is a sectional view illustrating an example of the structure of a wireless module of a first modified example.

FIG. 5(A) is a sectional view illustrating an example of the structure of the wireless module 1B of a first modified example. FIG. 5(B) is a sectional view illustrating an example of the structure of the wireless module 1C of a second modified example. In FIGS. 5(A) and 5(B), the set substrate 10 and components (for example, LSIs 8 and 9) fixed on the bottom surface of the module substrate 3 are not shown.

In FIG. 5(A), a heat dissipating component 5B is not disposed adjacent to the GND pattern 11. A portion (an example of the first portion) of the heat dissipating component 5B opposing the GND pattern 11 extends along the housing 7. A recessed portion 5g1 of the heat dissipating component 5B in which openings 5a and 5b are formed is symmetrically arranged with respect to the center of a bottom surface 5p1 (an example of the second portion) of the recessed portion 5g1. A wall surface 5h1 (an example of a third portion) of the recessed portion 5g1 linked to the housing 7 is formed along a direction (Z direction) perpendicular to the bottom surface 5p1.

According to the first modified example, heat dissipation can be performed while reducing the influence on radiation patterns of radio waves generated from the antennas 13 and 15.

In FIG. 5(B), a heat dissipating component 5C is not disposed adjacent to the GND pattern 11. A portion of the heat dissipating component 5C opposing the GND pattern 11 extends along the housing 7. A recessed portion 5g2 of the heat dissipating component 5C in which openings 5a and 5b are formed is symmetrically arranged with respect to the center of a bottom surface 5p2 of the recessed portion 5g2. A wall surface 5h2 of the recessed portion 5g2 linked to the housing 7 has a tapered surface radially extending from the periphery of the end portion of the bottom surface 5p2.

According to the second modified example, it is possible to respond to the expansion of radiation patterns of radio waves generated from the antennas 13 and 15, thereby suppressing the degradation of the directivity. It is thus possible to further reduce the influence on radiation patterns from the antennas 13 and 15.

In this manner, since the heat dissipating components 5B and 5C include the recessed portions 5g1 and 5g2, respectively, it is possible to prevent the degradation of radiation patterns from the antennas 13 and 15 and also to secure the amount of heat dissipated to the housing 7.

FIG. 6(A) is a sectional view illustrating an example of the structure of the wireless module 1D of a third modified example. FIG. 6(B) is a sectional view illustrating an example of the structure of the wireless module 1E of a fourth modified example. FIG. 6(C) is a sectional view illustrating an example of the structure of the wireless module 1F of a fifth modified example. In FIGS. 6(A) through 6(C), the set substrate 10 and components (for example, LSIs 8 and 9) fixed on the bottom surface of the module substrate 3 are not shown.

In FIGS. 6(A) through 6(C), recessed portions 5g3 through 5g5 of the wireless modules 1D through 1F, respectively, are not in contact with the housing 7 in at least one of the X-axis positive direction, the X-axis negative direction, the Y-axis positive direction, and the Y-axis negative direction on the X-Y plane. For example, in each of FIGS. 6(A) through 6(C), although an opening 5a is formed in part of the bottom surface 5g of the recessed portion of the heat dissipating component, a wall surface of the recessed portion is not formed on the X-axis negative side of the opening 5a. The heat dissipating component 5 is not connected to the housing 7 on the X-axis negative side of the recessed portion of the heat dissipating component.

The wireless module 1D shown in FIG. 6(A) is different from the wireless module 1A included in the wireless apparatus 100A shown in FIG. 4 in that, on the X-axis negative side of the openings 5a and 5b, a heat dissipating component 5D has no wall surface of the recessed portion 5g3 opposing the antennas 13 and 15, and is not connected to the housing 7. That is, in the X direction and in the Y direction, the heat dissipating component 5D includes a portion on the X-axis positive side (closer to the GND pattern 11) of the openings 5a and 5b.

The wireless module 1E shown in FIG. 6(B) is different from the wireless module 1B shown in FIG. 5(A) in that, on the X-axis negative side of the openings 5a and 5b, a heat dissipating component 5E has no wall surface of the recessed portion 5g4 opposing the antennas 13 and 15, and is not connected to the housing 7. That is, in the X direction and in the Y direction, the heat dissipating component 5E includes a portion on the X-axis positive side (closer to the GND pattern 11) of the openings 5a and 5b.

The wireless module 1F shown in FIG. 6(C) is different from the wireless module 1C shown in FIG. 5(B) in that, on the X-axis negative side of the openings 5a and 5b, a heat dissipating component 5F has no wall surface of the recessed portion 5g5 opposing the antennas 13 and 15, and is not connected to the housing 7. That is, in the X direction and in the Y direction, the heat dissipating component 5F includes a portion on the X-axis positive side (closer to the GND pattern 11) of the openings 5a and 5b.

In this manner, although part of each of the heat dissipating components 5D through 5F positioned on the X-axis negative side (closer to the antennas 13 and 15) of the openings 5a and 5b is omitted, the heat dissipating components 5D through 5F are partially positioned above the GND pattern 11 through which a great amount of heat passes and are thermally in contact with the GND pattern 11. Accordingly, it is possible to efficiently transfer heat generated from, for example, the LSI 9 positioned below the GND pattern 11. Additionally, since the amount of material used for the heat dissipating components 5D through 5F can be decreased, the weight and the cost of the heat dissipating components 5D through 5F is also reduced. Moreover, it is possible to mount the heat dissipating components 5D through 5F by considering the mounting space or the arrangement position.

The present disclosure is not restricted to the configurations of the above-described embodiments, and may be applicable to any configuration as long as the functions recited in the claims or the functions of the embodiments are implemented with such a configuration.

For example, in the above-described embodiments, an opening is not formed in the housing 7. However, an opening may be formed in the housing 7 at a position it opposes the opening formed in a heat dissipating component. With this configuration, it is possible to further enhance the heat dissipation effect.

In the above-described embodiments, instead of causing a heat dissipating component to be in contact with the GND pattern 11, the heat dissipating component may be thermally in contact with the GND pattern 11 with a material having a high thermal conductivity (for example, mica) therebetween.

In the above-described embodiments, a heat dissipating component is fixed such that it is thermally in contact with one of the set substrate 10 and the housing 7. However, a heat dissipating component may be fixed such that it is thermally in contact with both of the set substrate 10 and the housing 7, thereby further enhancing the heat dissipation effect.

In the above-described first embodiment, a heat dissipating component is fixed to a module substrate. However, a heat dissipating component may be fixed to another substrate within a wireless module.

A description has been given of a case in which the influence on radiation patterns is reduced by separating an antenna and the edge of an opening from each other by $\lambda/2$ or greater. However, if radiation patterns from an antenna are modified, the distance between an antenna and the edge of an opening may be $\lambda/2$ or smaller.

A description has been given of a case in which a metal or graphite is used as the material for a heat dissipating component. However, by the use of a dielectric material using, for example, an ABS resin, advantages similar to the advantages obtained by the use of a metal or graphite are also achieved.

Overview of Aspects of the Present Disclosure

According to a first aspect of the present disclosure, there is provided a wireless module including: a first substrate having a first surface on which a plurality of antennas and a ground portion are disposed; and a heat dissipating member disposed opposite the first surface of the first substrate. The heat dissipating member includes openings to which the plurality of associated antennas are exposed and an intervening portion which intervenes between the openings, and the ground portion is disposed between the first substrate and the heat dissipating member.

According to a second aspect of the present disclosure, in the wireless module of the first aspect, the intervening portion may be formed such that a positional relationship between an antenna and the associated opening is identical to a positional relationship between another antenna and the associated opening.

According to a third aspect of the present disclosure, in the wireless module of the first or second aspect, the ground portion may be thermally in contact with an electronic component which generates a predetermined amount or a greater amount of heat.

According to a fourth aspect of the present disclosure, there is provided a wireless device including the wireless module of one of the first through third aspects. The heat dissipating member is thermally in contact with a second substrate on which the wireless module is mounted.

According to a fifth aspect of the present disclosure, in the wireless device of the fourth aspect, the heat dissipating member may be thermally in contact with a housing which opposes the wireless module.

According to a sixth aspect of the present disclosure, in the wireless device of the fifth aspect, a distance between the heat dissipating member and the ground portion may be a predetermined amount or smaller.

According to a seventh aspect of the present disclosure, in the wireless device of the fifth aspect, the heat dissipating member may include a first portion disposed adjacent to and along the housing, a second portion including the opening and disposed adjacent to and along the first substrate, and a third portion that connects the first portion and the second portion.

According to an eighth aspect of the present disclosure, in the wireless device of the seventh aspect, the third portion of the heat dissipating member may include a tapered surface using the second portion as a bottom portion.

According to a ninth aspect of the present disclosure, in the wireless device of the seventh or eighth aspect, the second portion and the third portion of the heat dissipating member may form a substantially symmetrical configuration with respect to the second portion in a direction perpendicular to the second portion.

INDUSTRIAL APPLICABILITY

A wireless module of the present disclosure, which is capable of improving heat dissipation while suppressing degradation of antenna characteristics, is useful.

REFERENCE SIGNS LIST 1, 1A, 1B, 1C, 1D, 1E, 1F wireless module
3 module substrate
3a metallic layer
3b dielectric layer
3c GND layer
3d wiring layer
5, 5A, 5B, 5C, 5D, 5E, 5F heat dissipating component
5a, 5b opening
5c intervening portion
5e substrate opposing surface
5i remaining portion
5g, 5g1, 5g2, 5g3, 5g4, 5g5 recessed portion
5h1, 5h2 wall surface of recessed portion
5p1, 5p2 bottom surface of recessed portion
7 housing
8, 9 LSI
10 set substrate
11 GND pattern
13, 15 antenna
13a, 13b patch antenna
17, 18, 36 signal via-hole
19, 33 GND via-hole
21a, 21b, 21c, 21d pad
22a, 22b, 22c, 22d solder ball
27 molding portion
100, 100A wireless apparatus

The invention claimed is:

1. A wireless device, comprising:
   a first substrate having a first surface on which a plurality of antennas and a ground portion are disposed;
   a housing having a second surface which is opposite side of the first surface of the first substrate; and
   a heat dissipating member disposed between the first surface of the first substrate and the second surface of the housing, wherein
   the heat dissipating member includes a plurality of openings corresponding to the plurality of antennas respectively and an intervening portion which intervenes between the plurality of openings,
   the heat dissipating member is thermally in contact with the ground portion and the second surface of the housing, and
   a material of the heat dissipating member differs from a material of the housing.

2. The wireless device according to claim 1 wherein the intervening portion is formed such that a positional relationship between a first antenna of the plurality of antennas and a first opening of the plurality of openings is identical to a positional relationship between a second antenna of the plurality of antennas and a second opening of the plurality of openings.

3. The wireless device according to claim 1 wherein the ground portion is thermally in contact with an electronic component which generates a determined amount or a greater amount of heat.

4. The wireless device according to claim 1, wherein a distance between the heat dissipating member and the ground portion is a determined amount or smaller.

5. The wireless device according to claim 1, wherein the heat dissipating member includes
   a first portion disposed adjacent to and along the housing,
   a second portion including the opening and disposed adjacent to and along the first substrate, and
   a third portion that connects the first portion and the second portion.

6. The wireless device according to claim 5, wherein the third portion of the heat dissipating member includes a tapered surface connected to the second portion as a bottom portion.

7. The wireless device according to claim 5, wherein the third portion of the heat dissipating member forms a symmetrical configuration with respect to the second portion in a direction perpendicular to the second portion.

8. The wireless device according to claim 1 wherein surfaces of the plurality of antennas and the ground portion are in a same plane.

9. The wireless device according to claim 1 wherein the heat dissipating member does not contact with the first surface of the first substrate.

* * * * *